(12) United States Patent
Mosden et al.

(10) Patent No.: US 10,573,564 B2
(45) Date of Patent: Feb. 25, 2020

(54) METHOD FOR FABRICATING NFET AND PFET NANOWIRE DEVICES

(71) Applicant: Tokyo Electron Limited, Minato-ku, Tokyo (JP)

(72) Inventors: Aelan Mosden, Poughkeepsie, NY (US); Cheryl Pereira, Loudonville, NY (US); Subhadeep Kal, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/965,606

(22) Filed: Apr. 27, 2018

(65) Prior Publication Data

US 2018/0315665 A1 Nov. 1, 2018

Related U.S. Application Data

(60) Provisional application No. 62/491,162, filed on Apr. 27, 2017.

(51) Int. Cl.
*H01L 21/8238* (2006.01)
*H01L 29/06* (2006.01)
(Continued)

(52) U.S. Cl.
CPC ...... *H01L 21/823821* (2013.01); *B82Y 10/00* (2013.01); *H01L 21/3065* (2013.01); *H01L 21/823807* (2013.01); *H01L 29/0653* (2013.01); *H01L 29/0669* (2013.01); *H01L 29/0673* (2013.01); *H01L 29/0847* (2013.01); *H01L 29/161* (2013.01); *H01L 29/42392* (2013.01); *H01L 29/66439* (2013.01); *H01L 29/66742* (2013.01); *H01L 29/66795* (2013.01);
(Continued)

(58) Field of Classification Search
CPC ....... H01L 21/823821; H01L 29/78696; H01L 29/42392; H01L 29/0673; H01L 21/823807; H01L 21/3065; H01L 29/66795; H01L 29/0669; H01L 29/161; H01L 21/823828
See application file for complete search history.

(56) References Cited

U.S. PATENT DOCUMENTS 9,029,835 B2 5/2015 Chu-King et al.
2011/0033966 A1 2/2011 Su et al.
(Continued)

OTHER PUBLICATIONS

Korean Intellectual Property Office (KIPO), International Search Report and Written Opinion, dated Aug. 14, 2018, 10 pages.

*Primary Examiner* — Anthony Ho

(57) ABSTRACT

Embodiments of the invention provide a method for forming NFET, PFET, or NFET and PFET nanowire devices on a substrate. According to one embodiment, the method includes providing a film stack containing a Si layer, a SiGe layer, and a Ge layer positioned between the Si layer and the SiGe layer, and selectively removing the Ge layer by etching that is selective to the Si layer and the SiGe layer, thereby forming an opening between the Si layer and the SiGe layer. According to another embodiment, the method providing a film stack containing alternating Si and Ge layers, and selectively removing the Ge layers by etching that is selective to the Si layers. According to another embodiment, the method includes providing a film stack containing a plurality of alternating SiGe and Ge layers, and selectively removing the plurality of Ge layers by etching that is selective to the SiGe layers.

20 Claims, 10 Drawing Sheets

(51) Int. Cl.
*H01L 29/161* (2006.01)
*H01L 29/66* (2006.01)
*H01L 21/3065* (2006.01)
*H01L 29/786* (2006.01)
*H01L 29/08* (2006.01)
*H01L 29/775* (2006.01)
*B82Y 10/00* (2011.01)
*H01L 29/423* (2006.01)

(52) U.S. Cl.
CPC ...... *H01L 29/775* (2013.01); *H01L 29/78684* (2013.01); *H01L 29/78696* (2013.01); *H01L 21/823828* (2013.01)

(56) References Cited

U.S. PATENT DOCUMENTS

| | | |
|---|---|---|
| 2013/0270512 A1 | 10/2013 | Radosavljevic et al. |
| 2015/0364603 A1 | 12/2015 | Cheng et al. |
| 2016/0204228 A1 | 7/2016 | Tapily et al. |

METHOD FOR FABRICATING NFET AND PFET NANOWIRE DEVICES

CROSS-REFERENCE TO RELATED APPLICATIONS

This application is related to and claims priority to U.S. Provisional Patent Application Ser. No. 62/491,162, filed on Apr. 27, 2017, the entire contents of which are herein incorporated by reference.

FIELD OF THE INVENTION

This invention relates to methods for processing a substrate, and more particularly, to methods for fabricating NFET and PFET nanowire devices.

BACKGROUND OF THE INVENTION

In device scaling beyond the 5 nm semiconductor technology node, there is motivation for a gate all-around (GAA) device architecture. A basic requirement for GAA is the formation of silicon-germanium (SiGe) and silicon (Si) nanowires. Fabricating either Si or SiGe nanowires (also known as nanowire release) requires an extremely selective, isotropic and precise SiGe and Si etching, respectively. A continuous and sealed SiN liner is formed around the nanowire. This step is critical for the subsequent epitaxial growth required for source/drain formation.

Currently, as schematically shown in FIGS. 1A-1C and 2A-2C, in order to make SiGe nanowires, a Si/SiGe stack of alternating Si and SiGe layers is used. As schematically shown in FIGS. 3A-3C, the selectivity of Si etch with respect to SiGe (and vice versa) is often times not high enough to maintaining the desired profile of the SiGe nanowires/nanosheets that is needed to deposit the SiN liner. In addition, inadequate Si etch selectivity with respect to SiGe results in corner rounding of the nanowires. These imperfections from the etching cause further downstream issues with electrical performance, including capacitance and shorting problems between the gate and adjacent source/drain metals, and gate functionality.

FIGS. 1A-1C schematically show conventional fabrication of a n-type field effect transistor (NFET). In FIG. 1A, the method includes forming a film stack 1 containing alternating Si layers (101, 103) and SiGe layers (102, 104) on a substrate 100, and a SiN cap layer 110. In FIG. 1B, the method includes performing a selective etching process that recedes the SiGe layers (102, 104) relative to the Si layers (101, 103). In FIG. 1C, the method includes depositing a SiN liner 120 over the film stack 1, anisotropically removing portions of the SiN liner 120, and epitaxially growing source and drain regions 122 on the Si layers (101, 103) extending through the SiN liner 120. Thereafter, the SiGe layers (102, 104) may be removed from the film stack 1 by selective etching to form freestanding Si nanowires (not shown).

FIGS. 2A-2C schematically show conventional fabrication of a p-type field effect transistor (PFET). In FIG. 2A, the method includes forming a film stack 2 containing alternating Si layers (201, 203) and SiGe layers (202, 204) on a substrate 200, and a SiN cap layer 210. In FIG. 2B, the method includes performing a selective etching process that recedes the Si layers (201, 203) relative to the SiGe layers (202, 204). In FIG. 2C, the method includes depositing a SiN liner 220 over the film stack 2, anisotropically removing portions of the SiN liner 220, and epitaxially growing source and drain regions 222 on the SiGe layers (202, 204) extending through the SiN liner 220. Thereafter, the Si layers (201, 203) may be removed from the film stack 2 by selective etching to form freestanding Si nanowires (not shown).

FIGS. 3A-3C shows some of the problems encountered during conventional fabrication of a PFET. In FIG. 3A, the film stack 3 contains alternating Si layers (301, 303) and SiGe layers (302, 304) on a substrate 300, and a SiN cap layer 310. As schematically shown in FIG. 3B, poor Si: SiGe etch selectivity can form rounded layer edge fronts, which in turn can lead to improper epitaxial growth of source and drain regions 322 on the SiGe layers (302, 304), and formation of a non-uniform SiN liner 320 schematically shown in FIG. 3C.

In the above described integration or process sequence, one of the major challenge is formation of the nanowires. In particular, the etch selectivity required to form the nanowires is often inadequate. In addition, the etching process also has to be isotropic in high aspect ratio structures. Such limitations and requirements require new novel integration and etch processes.

SUMMARY OF THE INVENTION

Embodiments of the invention provide a method for fabricating NFET and PFET nanowire devices. According to one embodiment, the method includes providing a film stack containing a Si layer, a SiGe layer, and a Ge layer positioned between the Si layer and the SiGe layer, and selectively removing the Ge layer by etching that is selective to the Si layer and the SiGe layer, thereby forming an opening between the Si layer and the SiGe layer.

According to one embodiment, the method is provided for forming a NFET. The method includes providing a substrate containing alternating Si and Ge layers, and selectively removing the Ge layers by etching that is selective to the Si layers, thereby forming an opening between the Si layers.

According to one embodiment, a method is provided for forming a PFET. The method includes providing a substrate containing a plurality of alternating SiGe and Ge layers, and selectively removing the plurality of Ge layers by etching that is selective to the SiGe layers, thereby forming an opening between the SiGe layers.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION OF SEVERAL EMBODIMENTS

Figure 1A:
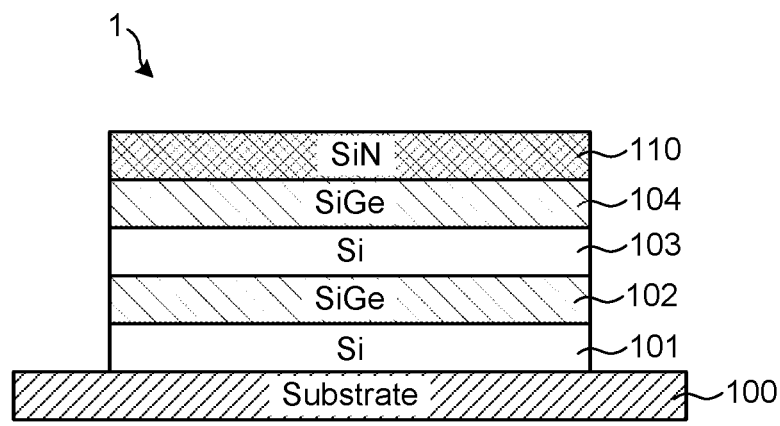
FIGS. 1A-1C schematically show conventional fabrication of a NFET.
Figure 1B:
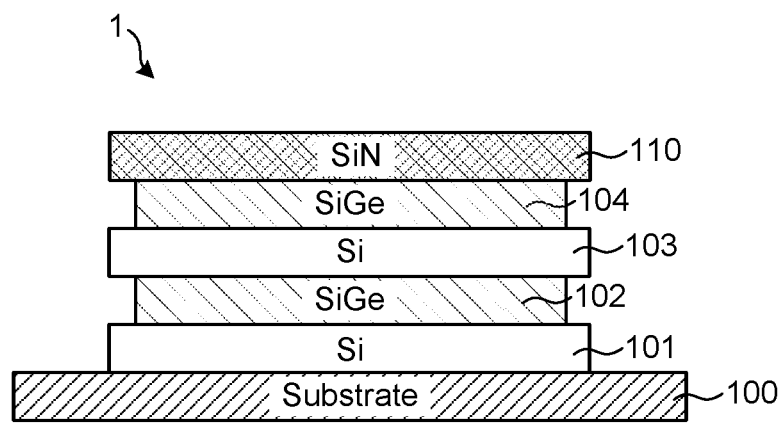
Figure 1C:
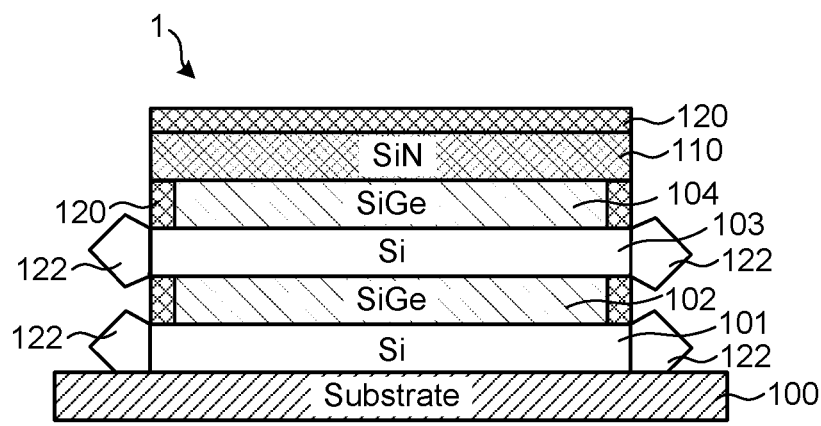
Figure 2A:
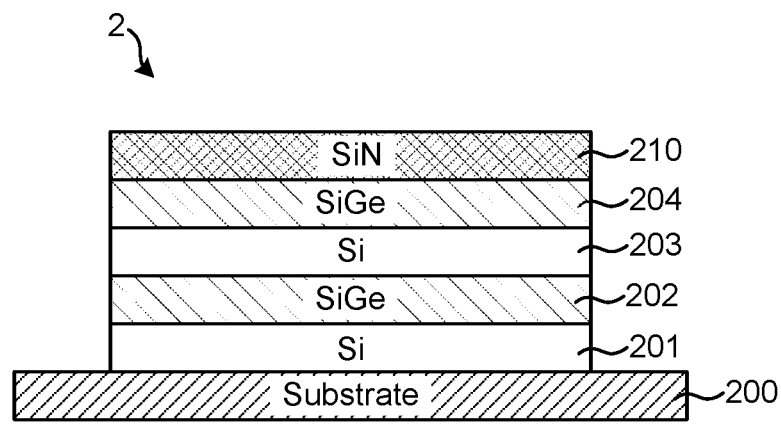
FIGS. 2A-2C schematically show conventional fabrication of a PFET.
Figure 2B:
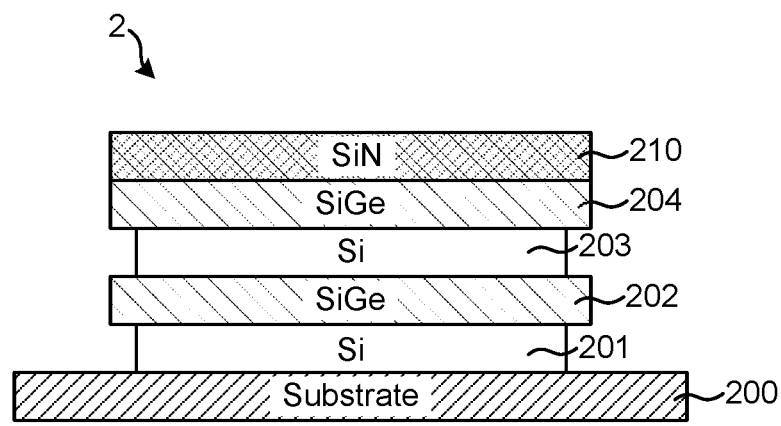
Figure 2C:
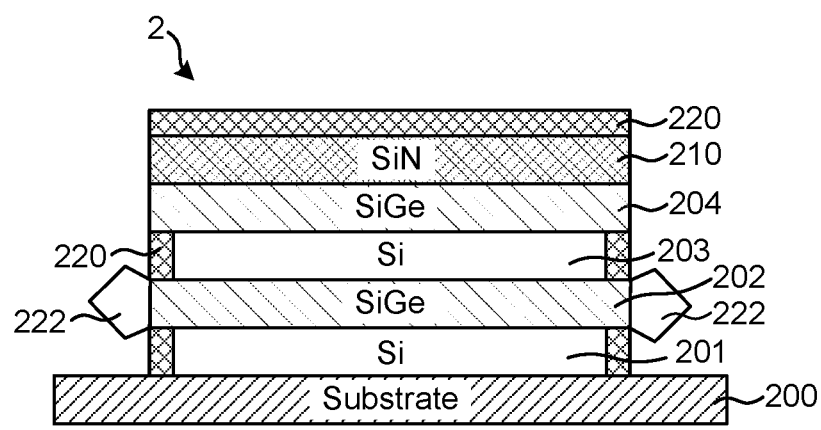
Figure 3A:
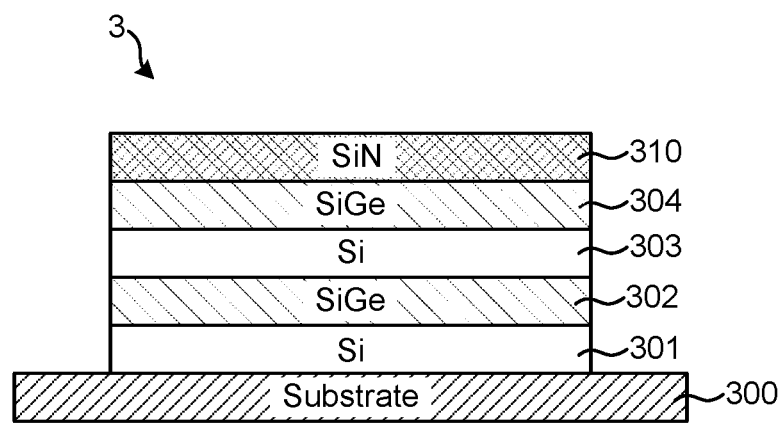
FIGS. 3A-3C shows some of the problems encountered during conventional fabrication of a PFET.
Figure 3B:
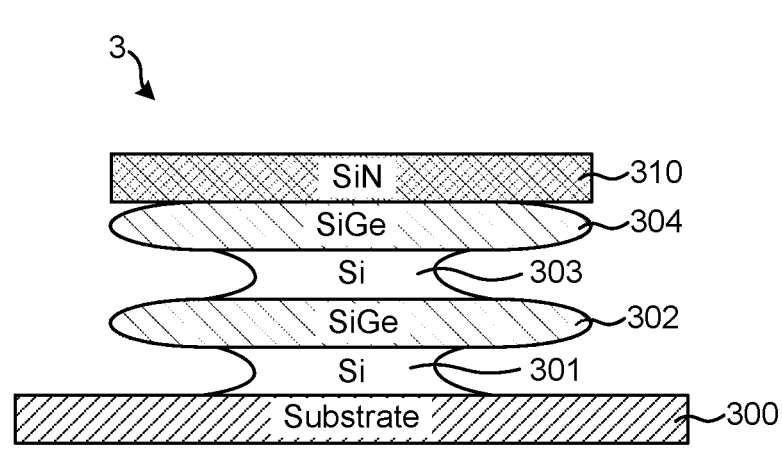
Figure 3C:
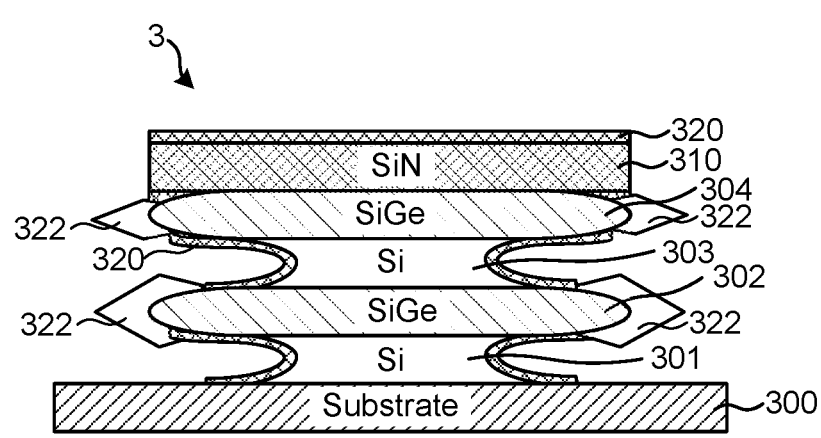

As described above, semiconductor fabrication currently uses a Si/SiGe stack to fabricate the corresponding Si and SiGe nanowires for NFETs and PFETs, respectively. This often involves many challenges in terms of integration and process sequence, including: requirement of separation of the NFET and PFET areas in a device, requirement of additional process steps in order to fabricate the separated NFET and PFET areas, requirement of additional steps to connect/wire the NFETs and PFETs, utilization of a large area/real estate in the die/device, and requirement of separate NFET and PFET area/pitch scaling for further technology nodes.

Embodiments of the invention describe the use of a Si/Ge/SiGe film stack to fabricate the corresponding Si (NFET) and SiGe (PFET) nanowires. This novel Si/Ge/SiGe stack offers many advantages in terms of integration and process sequence, including: NFET and PFET stacked on top of each other, simultaneous processing to fabricate the Si and SiGe nanowires by selectively etching the Ge layer, simple NFET-PFET wiring/connections, significant reduction in area usage within the chip, simultaneous pitch scaling advantages for future technology nodes, and possible integrations schemes without epitaxial growth for source and drain contacts, by directly contacting the nanowire terminals.

Embodiments of the invention describe a novel etch technique regarding selective Ge etch with respect to Si and SiGe for a Si/Ge/SiGe stack. Current industry trend for selective Si etch with respect to SiGe is using wet etch. On the other hand, for selective SiGe etch with respect to Si, there has been a significant research and development to tune existing plasma and gas phase based etches. Often times the challenges faced with the current selective Si and SiGe etches include lack of required Si: SiGe and SiGe: Si etch selectivity, lack of etch selectivity towards low-k spacers, oxide and other hard masks, pattern fidelity, pattern damage (in case of plasma processing), and material loading.

Embodiments of the invention describe a novel etching process, where etch selectivity is a function of Ge content and material loading. A conventional Si/SiGe stack is modified to include Si/Ge/SiGe stack, where a sacrificial Ge layer is utilized. This enables selectively etching the sacrificial Ge layer and fabricating Si and SiGe nanowires. This novel etching process may be carried out by thermal or plasma-assisted halogen-based gas phase etching that may be isotropic. Since the etch selectivity is based on Ge etch chemistry, very high selectivity towards Si and SiGe can be achieved. In one example, the etch byproduct from the Ge etch is a form of $Ge_{(1-(x+y+z))}(NH_3)_xF_yCl_z$, which can potentially be sublimated at higher temperature and reduced pressure. Some of the unique advantages of this novel etch are very high selective Ge etch with respect to Si and SiGe, etch selectivity towards a low-k spacer, oxide and other hardmasks, true isotropicity achievable during the etching process, applicability to high aspect ratio features due to the gas phase etching, and minimal pattern damage due to absence of plasma-excitation.

Figure 4A:
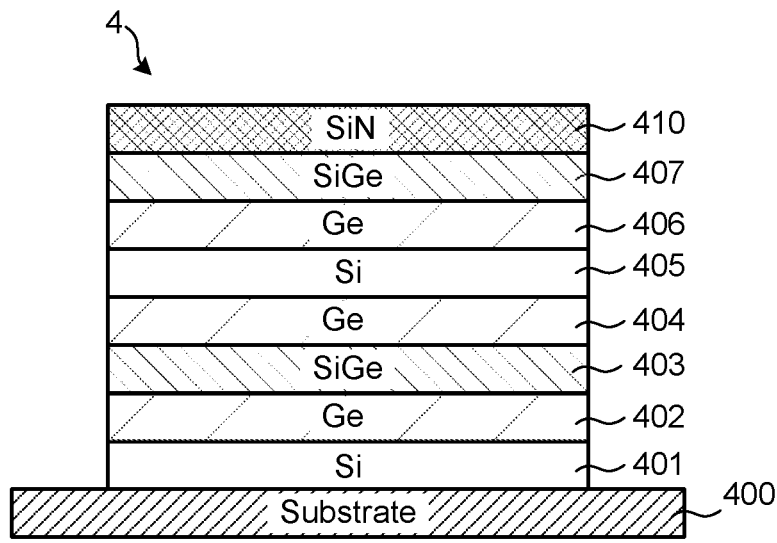
FIGS. 4A-4E schematically show fabrication of a NFET and a PFET according to an embodiment of the invention.

FIGS. 4A-4E schematically show fabrication of a NFET and a PFET according to an embodiment of the invention. In FIG. 4A, the method includes forming a film stack 4 containing alternating Si layers (401, 405), SiGe layers (403, 407), and Ge layers (402, 404, 406) on a substrate 400, and a SiN cap layer 410, where each Ge layer is positioned between a Si layer and a SiGe layer. In one example, a thickness of the SiGe layers can be about 20 nm, a thickness of the Ge layers can be about 25 nm, and a thickness of the Si layers can be about 20 nm.

Figure 4B:
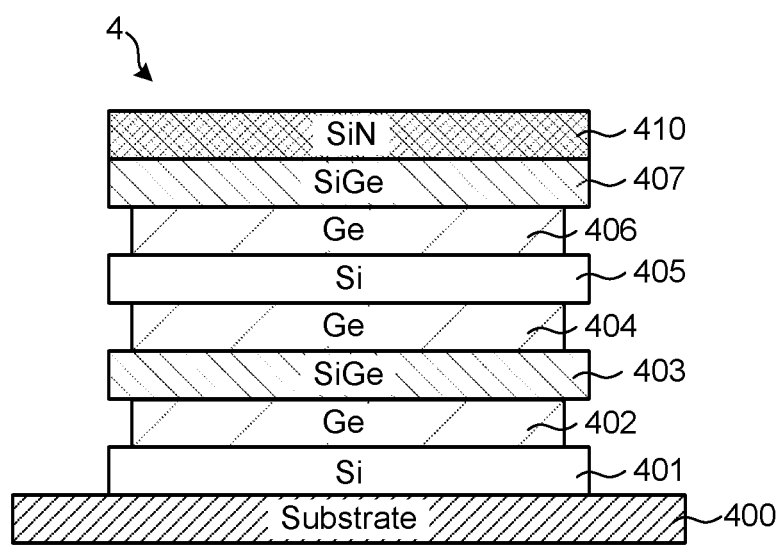
Figure 4C:
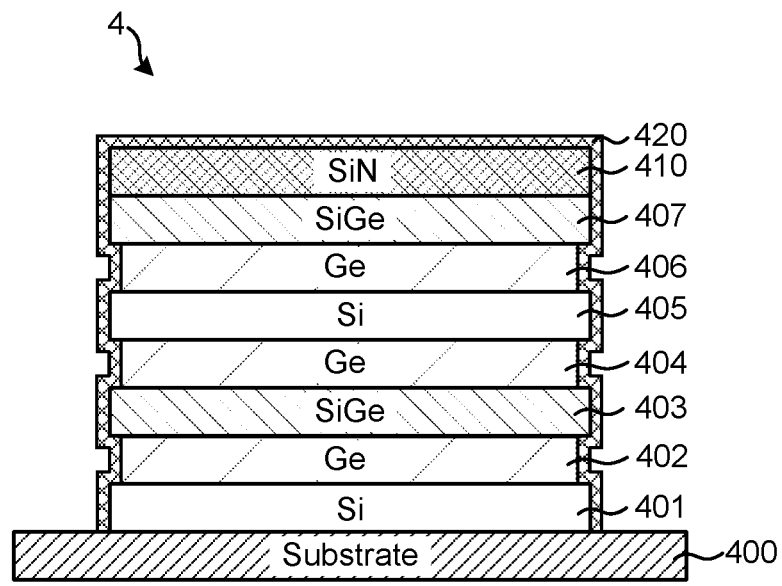
Figure 4D:
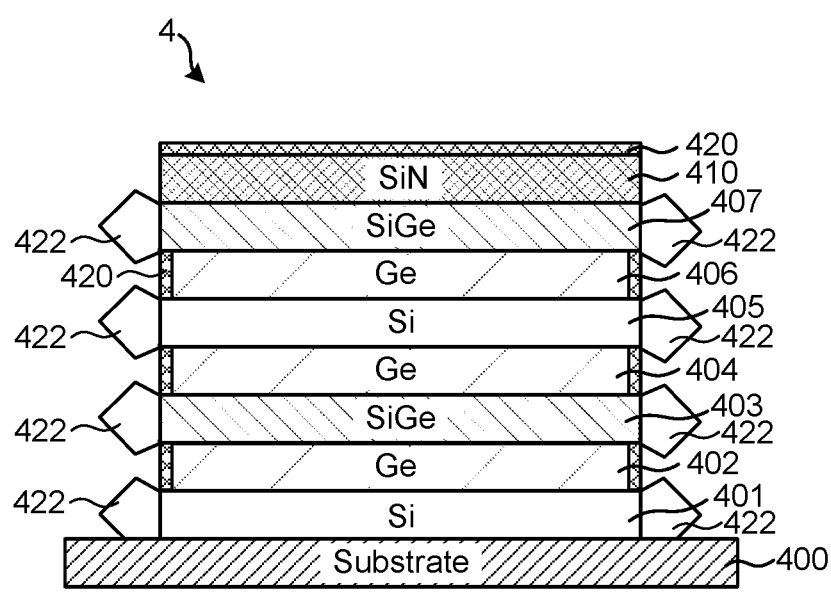
Figure 4E:
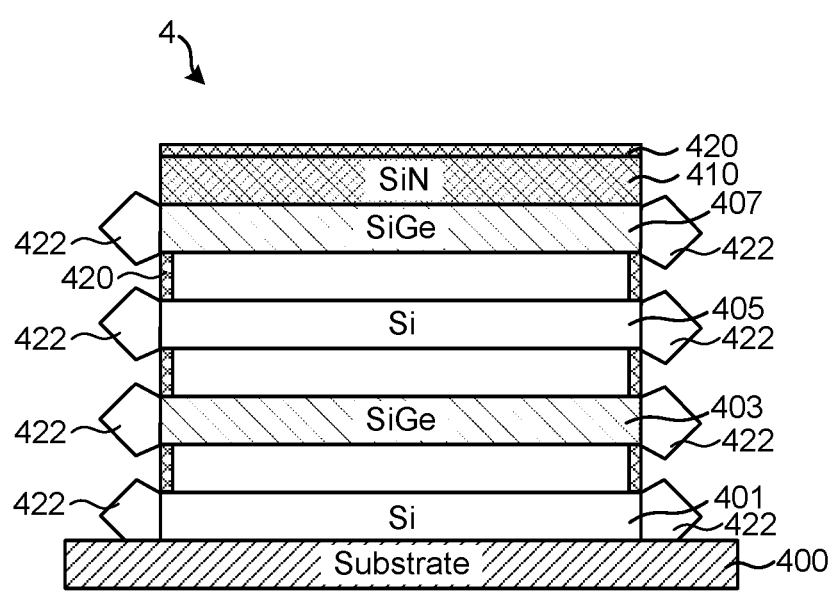

In the example in FIG. 4A, the film sequence is Si/Ge/SiGe/Ge/Si/Ge/SiGe. In FIG. 4B, the method includes performing a selective etching process that recedes the Ge layers (402, 404, 406) relative to the Si layers (401, 405) and the SiGe layers (403, 407). In FIG. 4C, the method includes depositing a SiN liner 420 over the film stack 4 and, in FIG. 4D, anisotropically removing portions of the SiN liner 420, and epitaxially growing source and drain regions 422 on the Si layers (401, 405) and the SiGe layers (403, 407) extending through the SiN liner 420. Thereafter, as depicted in FIG. 4E, the Ge layers (402, 404, 406) may be removed from the film stack 4 by etching that is selective to Si and SiGe to form freestanding Si nanowires and SiGe nanowires that are separated by openings. The Si nanowires form a portion of a NFET and the SiGe nanowires form a portion of a PFET in the film stack 4. Thereafter, the film stack 4 may be further processed by depositing a dielectric layer that encapsulates the Si and SiGe nanowires, and depositing a metal-containing gate electrode layer that fully fills the remaining openings between the Si and SiGe nanowires.

Figure 5A:
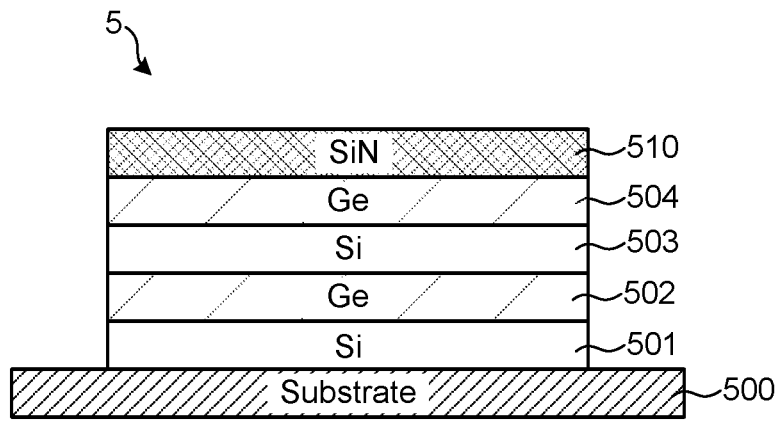
FIGS. 5A-5D schematically show fabrication of a NFET according to an embodiment of the invention.
Figure 5B:
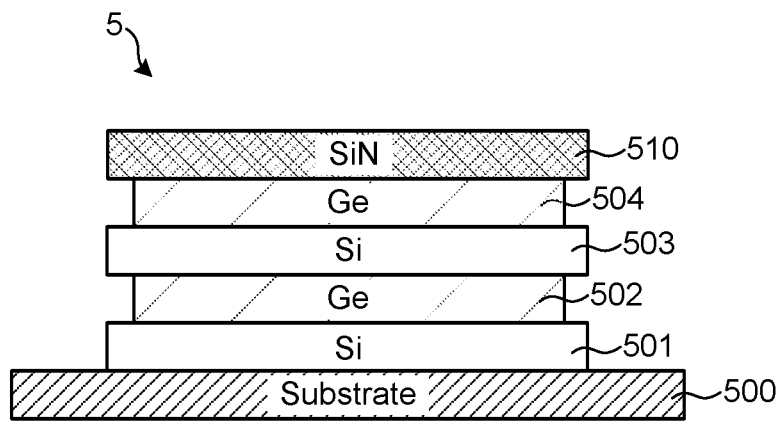
Figure 5C:
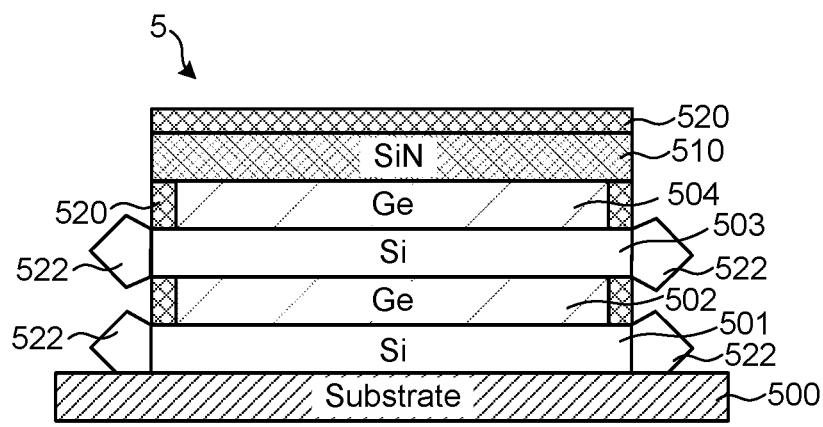
Figure 5D:
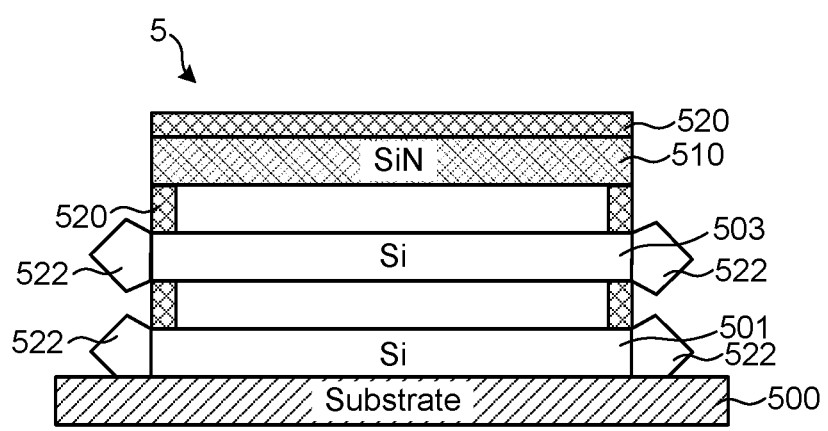

FIGS. 5A-5D schematically show fabrication of a NFET according to an embodiment of the invention. In FIG. 5A, the method includes forming a film stack 5 containing alternating Si layers (501, 503) and Ge layers (502, 504) on a substrate 500, and a SiN cap layer 510. In FIG. 5B, the method includes performing a selective etching process that recedes the Ge layers (502, 504) relative to the Si layers (501, 503). In FIG. 5C, the method includes depositing a SiN liner 520 over the film stack 5, anisotropically removing portions of the SiN liner 520, and epitaxially growing source and drain regions 522 on the Si layers (501, 503) extending through the SiN liner 520. Thereafter, as depicted in FIG. 5D, the Ge layers (502, 504) may be removed from the film stack 5 by etching that is selective to Si to form freestanding Si nanowires that are separated by openings. The Si nanowires form a portion of a NFET in the film stack 5. Thereafter, the film stack 5 may be further processed by depositing a dielectric layer that encapsulates the Si nanowires, and depositing a metal-containing gate electrode layer that fully fills the remaining openings between the Si nanowires.

Figure 6A:
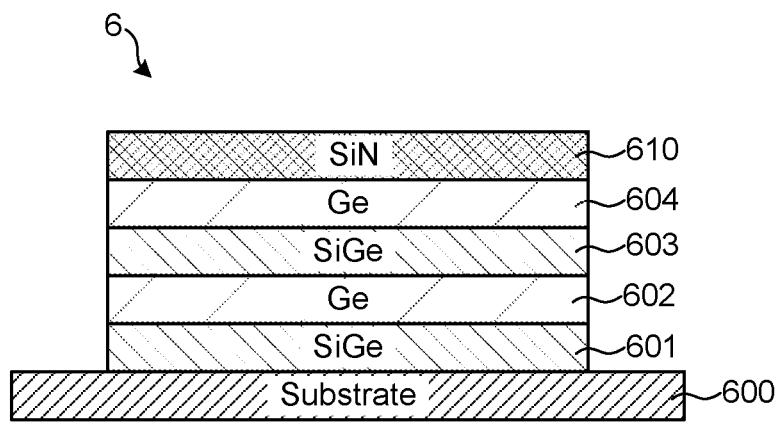
FIGS. 6A-6D schematically show fabrication of a PFET according to an embodiment of the invention.
Figure 6B:
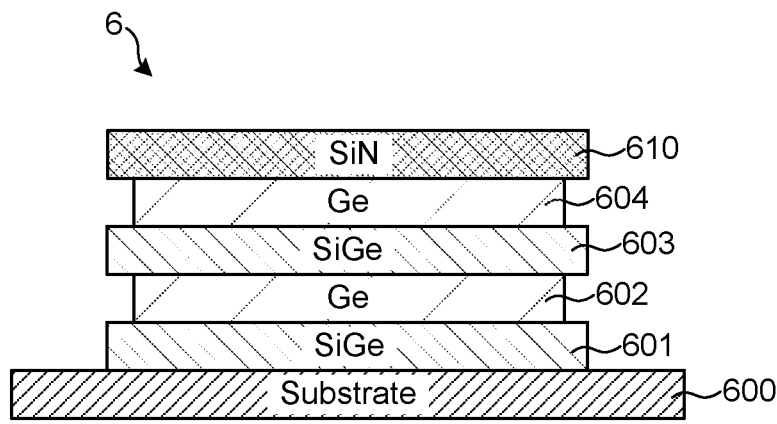
Figure 6C:
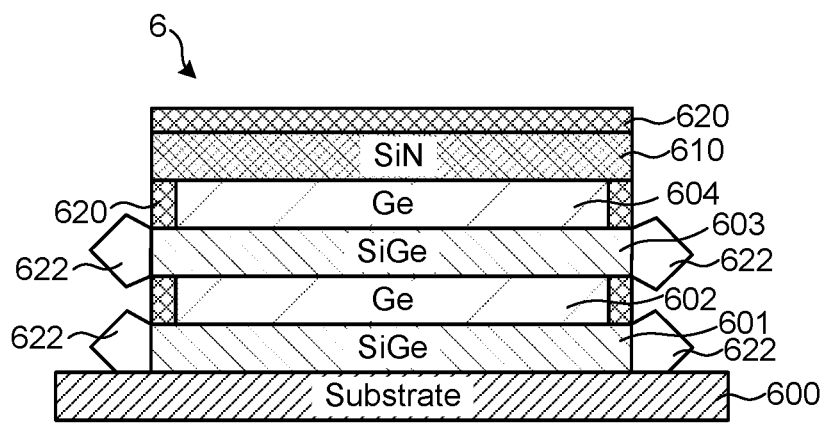
Figure 6D:
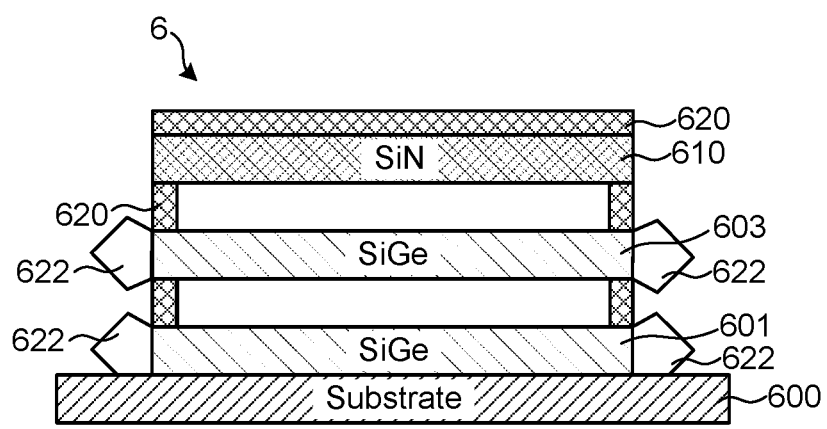

FIGS. 6A-6D schematically show fabrication of a PFET nanowire transistor according to an embodiment of the invention. In FIG. 6A, the method includes forming a film stack 6 containing alternating SiGe layers (601, 603) and Ge layers (602, 604) on a substrate 600, and a SiN cap layer 610. In FIG. 6B, the method includes performing a selective etching process that recedes the Ge layers (602, 604) relative to the SiGe layers (601, 603). In FIG. 6C, the method includes depositing a SiN liner 620 over the film stack 6, anisotropically removing portions of the SiN liner 620, and epitaxially growing source and drain regions 622 on the SiGe layers (601, 603) extending through the SiN liner 620. Thereafter, as depicted in FIG. 6D, the Ge layers (602, 604) may be removed from the film stack 6 by etching that is selective to SiGe to form freestanding SiGe nanowires that are separated by openings. The SiGe nanowires form a portion of a PFET in the film stack 6. Thereafter, the film stack 6 may be further processed by depositing a dielectric layer that encapsulates the SiGe nanowires, and depositing a metal-containing gate electrode layer that fully fills the remaining openings between the SiGe nanowires.

According to one embodiment, the selective etching of the Ge layers relative to the Si layers and the SiGe layers may be performed by thermal or plasma-assisted halogen-based gas phase etching. The plasma-assisted halogen-based gas phase etching can utilize a remote plasma source. The thermal or plasma-assisted halogen-based gas phase etching can include a chlorine-containing gas (e.g., $Cl_2$), a fluorine-containing gas (e.g., $F_2$), a chlorine-containing gas and a fluorine-containing gas (e.g., $Cl_2$ and $F_2$), or a chlorine- and fluorine-containing gas (e.g., $ClF_3$). In some examples, the thermal or plasma-assisted halogen-based gas phase etching can include $Cl_2$, $F_2$, $ClF_3$, or a combination thereof. In one example, the halogen-based gas phase etching can include $F_2$ and $NH_3$. In one example, the plasma-assisted halogen-based gas phase etching can include $Cl_2$ gas that is plasma excited in the process chamber and exposed to the substrate without applying a bias to the substrate.

A plurality of embodiments for forming a NFET, a PFET, or a NFET and a PFET on a substrate have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a nanowire transistor on a substrate, the method comprising:
   providing a film stack containing a Si layer, a SiGe layer, and a Ge layer positioned between the Si layer and the SiGe layer;
   selectively removing the Ge layer by etching that is selective to the Si layer and the SiGe layer, thereby forming an opening between the Si layer and the SiGe layer;
   depositing a dielectric layer that encapsulates the Si layer and the SiGe layer; and
   depositing a metal-containing gate electrode layer that fully fills the opening between the Si layer and the SiGe layer.

2. The method of claim 1, wherein the selectively removing includes thermal or plasma-assisted halogen-based gas phase etching.

3. The method of claim 2, wherein the plasma-assisted halogen-based gas phase etching utilizes a remote plasma source.

4. The method of claim 2, wherein the thermal or plasma-assisted halogen-based gas phase etching includes a chlorine-containing gas, a fluorine-containing gas, a chlorine-containing gas and fluorine-containing gas, or a chlorine- and fluorine-containing gas.

5. The method of claim 2, wherein the thermal or plasma-assisted halogen-based gas phase etching includes $Cl_2$, $F_2$, $ClF_3$, or a combination thereof.

6. The method of claim 2, wherein the thermal or plasma-assisted halogen-based gas phase etching includes $F_2$ and $NH_3$.

7. A method of forming a nanowire transistor on a substrate, the method comprising:
   providing a film stack containing a Si layer, a SiGe layer, and a Ge layer positioned between the Si layer and the SiGe layer; and
   selectively removing the Ge layer by etching that is selective to the Si layer and the SiGe layer, thereby forming an opening between the Si layer and the SiGe layer, wherein the Si layer forms a portion of a n-type field effect transistor (NFET) and the SiGe layer forms a portion of a p-type field effect transistor (PFET), and the Si layer and the SiGe layer are vertically stacked with one on top of the other.

8. The method of claim 7, wherein the selectively removing includes thermal or plasma-assisted halogen-based gas phase etching.

9. A method of forming a n-type field effect transistor (NFET), the method comprising:
   providing a substrate containing alternating Si and Ge layers;
   selectively removing the Ge layers by etching that is selective to the Si layers, thereby forming an opening between the Si layers;
   depositing a dielectric layer that encapsulates the Si layers; and
   depositing a metal-containing gate electrode layer that fully fills the opening between the Si layers.

10. The method of claim 9, wherein the selectively removing includes thermal or plasma-assisted halogen-based gas phase etching.

11. The method of claim 10, wherein the plasma-assisted halogen-based gas phase etching utilizes a remote plasma source.

12. The method of claim 10, wherein the thermal or plasma-assisted halogen-based gas phase etching includes a chlorine-containing gas, fluorine-containing gas, a chlorine-containing gas and a fluorine-containing gas, or a chlorine- and fluorine-containing gas.

13. The method of claim 10, wherein the thermal or plasma-assisted halogen-based gas phase etching includes $Cl_2$, $F_2$, $ClF_3$, or a combination thereof.

14. The method of claim 10, wherein the thermal or plasma-assisted halogen-based gas phase etching includes $F_2$ and $NH_3$.

15. A method of forming a p-type field effect transistor (PFET), the method comprising:
   providing a substrate containing alternating SiGe and Ge layers;
   selectively removing the Ge layers by etching that is selective to the SiGe layers, thereby forming an opening between the SiGe layers;
   depositing a dielectric layer that encapsulates the SiGe layers; and
   depositing a metal-containing gate electrode layer that fully fills the opening between the SiGe layers.

16. The method of claim 15, wherein the selectively removing includes thermal or plasma-assisted halogen-based gas phase etching.

17. The method of claim 16, wherein the plasma-assisted halogen-based gas phase etching utilizes a remote plasma source.

18. The method of claim 16, wherein the thermal or plasma-assisted halogen-based gas phase etching includes a chlorine-containing gas, fluorine-containing gas, a chlorine-containing gas and a fluorine-containing gas, or a chlorine- and fluorine-containing gas.

19. The method of claim 16, wherein the thermal or plasma-assisted halogen-based gas phase etching includes $Cl_2$, $F_2$, $ClF_3$, or a combination thereof.

20. The method of claim 16, wherein the thermal or plasma-assisted halogen-based gas phase etching includes $F_2$ and $NH_3$.

* * * * *